(12) United States Patent
Chen et al.

(10) Patent No.: US 8,194,490 B2
(45) Date of Patent: Jun. 5, 2012

(54) ELECTRICAL FUSE MEMORY ARRAYS (75) Inventors: Po-Hung Chen, Taipei (TW);
Chin-Huang Wang, Pingjhen (TW);
Yen-Chieh Huang, Zhubei (TW);
Sung-Chieh Lin, Zhubei (TW);
Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 9 days.

(21) Appl. No.: 12/877,646

(22) Filed: Sep. 8, 2010

(65) Prior Publication Data
US 2012/0057423 A1    Mar. 8, 2012

(51) Int. Cl.
*G11C 17/18* (2006.01)

(52) U.S. Cl. .......... 365/225.7; 365/189.09; 365/231; 365/207; 365/196

(58) Field of Classification Search .......... 365/225.7, 365/189.09, 231, 207, 196
See application file for complete search history.

(56) References Cited

U.S. PATENT DOCUMENTS
2010/0244144 A1* 9/2010 Hsueh et al. .......... 257/379

OTHER PUBLICATIONS

Kulkarni, Sarvesh H., et al., "A 4 kb Metal-Fuse OTP-ROM Macro Featuring a 2 V Programmable 1.37 um2 1T1R Bit Cell in 32 nm High-k Metal-Gate CMOS", IEEE Journal of Solid-State Circuits, vol. 45, No. 4, Apr. 2010. pp. 863-868.

* cited by examiner

*Primary Examiner* — Thong Q Le
(74) *Attorney, Agent, or Firm* — Lowe Hauptman Ham & Berner, LLP (57) ABSTRACT

Some embodiments regard a memory array that has a plurality of eFuse memory cells arranged in rows and columns, a plurality of bit lines, and a plurality of word lines. A column includes a bit line selector, a bit line coupled to the bit line selector, and a plurality of eFuse memory cells. An eFuse memory cell of the column includes a PMOS transistor and an eFuse. A drain of the PMOS transistor is coupled to a first end of the eFuse. A gate of the PMOS transistor is coupled to a word line. A source of the PMOS transistor is coupled to the bit line of the column.

20 Claims, 6 Drawing Sheets

ELECTRICAL FUSE MEMORY ARRAYS

FIELD

The present disclosure is related to electrical fuse (eFuse) memory arrays.

BACKGROUND

In existing eFuse memory arrays, a voltage (e.g., voltage VPRG) higher than the normal operational voltage (e.g., voltage VDD) is commonly used to program the eFuse in the eFuse memory cell. For example, in some approaches, voltage VPRG is about 1.8 V while the normal operation voltage VDD is about 0.85 V. Depending on the configuration of the eFuses and/or the memory array, when an eFuse is programmed, some select (or program) transistors used to select the memory cells for programming are subject to a voltage stress from the high voltage VPRG. As a result, there is a need to improve the situations.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Exemplary Circuit in Some Embodiments

Figure 1:
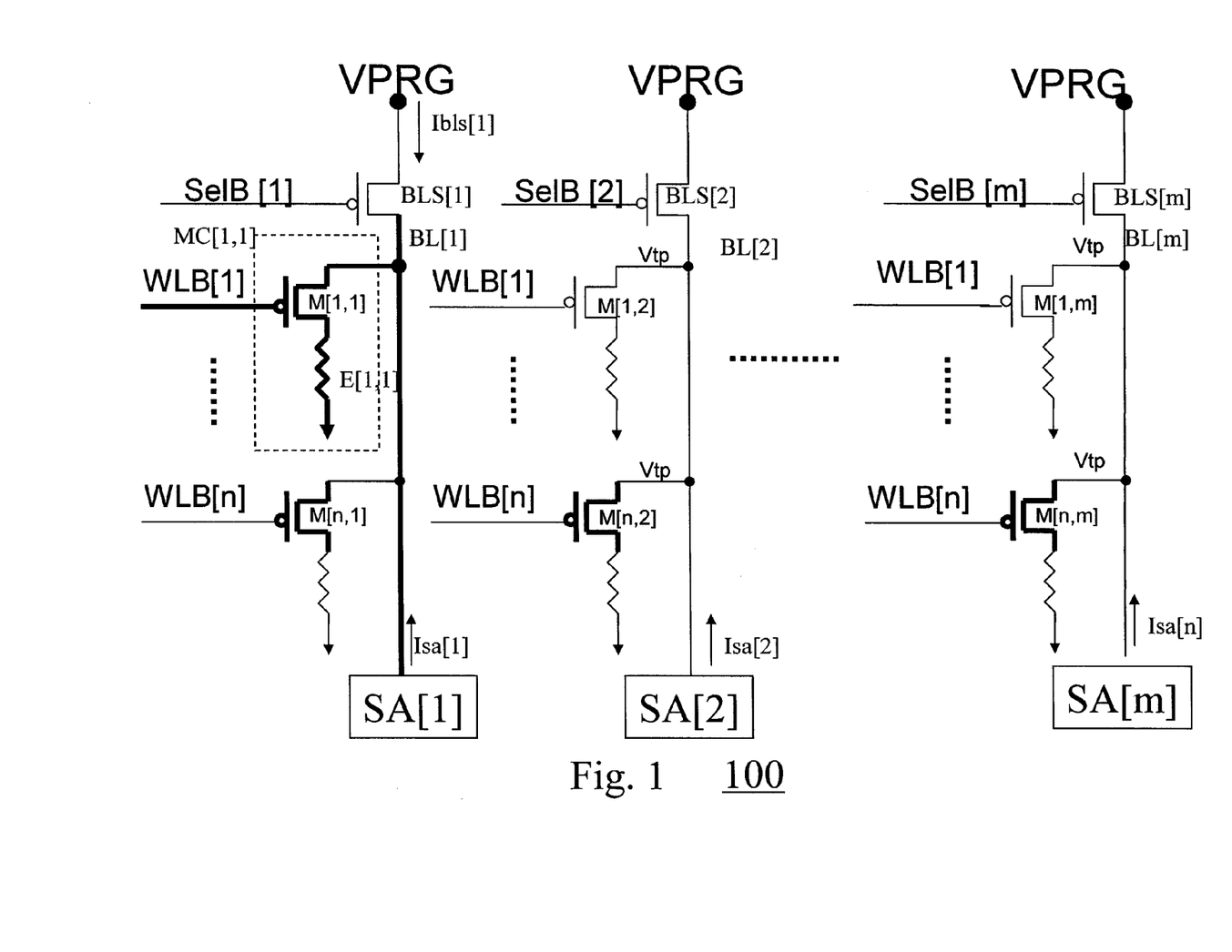
FIG. 1 is a diagram of an eFuse memory array in accordance with some embodiments.

FIG. 1 is a diagram of an eFuse memory array 100, in accordance with some embodiments. Memory array 100 includes m columns and n rows of eFuse memory cells MC (e.g., bit cells MC) associated with m bit lines BL (e.g., bit line BL[1] to bit line BL[m]) and n word lines WLB (e.g., word line WLB[1] to word line WLB[n]). In some embodiments, memory array 100 is a 64×64 cell array (e.g., m=n=64), but the various embodiments are not so limited. In some embodiments, m and n can be any positive number. In some embodiments, the PMOS transistors (e.g., transistors M[1,1] to M[n,m]) in eFuse memory array 100 are situated in a high voltage N-well, and the high voltage is voltage VPRG, which is the voltage to program the eFuses or the eFuse memory cells.

A transistor BLS is commonly called a bit line selector, a bit line select device, etc. A signal SelB controls a corresponding transistor BLS. For example, when a signal SelB (e.g., signal SelB[1]) is activated (e.g., driven with a high logic level (a High)), signal SelB turns on the corresponding transistor BLS (e.g., transistor BLS[1]), and when signal SelB[1] is de-activated (e.g., driven with a low logic level (a Low)), signal SelB[1] turns off the corresponding transistor BLS[1]. In some embodiments, a transistor BLS (e.g., transistor BLS[1]) is turned on to generate a current (e.g., current Ibsl[1]) to program a memory cell MC on the corresponding bit line (e.g., bit line BL[1]) and is turned off when a memory cell MC on the bit line is read. A transistor BLS is used as a bit line selector for illustration, other devices (e.g., switches, circuitry, current sources) are within the scope of the various embodiments.

Each bit line BL (e.g., bit line BL[1]) is coupled to the drain of a corresponding transistor BLS (e.g., transistor BLS[1]), and is associated with n eFuse memory cells (e.g., a set of eFuse memory cells MC[1,1] to MC[n,1]) in a column.

In some embodiments, an eFuse memory cell MC includes a PMOS transistor M and an eFuse E coupled in series. For illustration, only details of eFuse memory cell MC[1,1] are shown that includes an eFuse E[1,1] and a PMOS transistor M[1,1]. The below illustrative description in this document is based on memory cell MC[1,1]. The configuration and operation of other memory cell MC, however, are similar to those of memory cell MC[1,1]. The source of each transistor M (e.g., transistor M[1,1]) is coupled to a corresponding bit line (e.g., bit line BL[1]). The drain of transistor M[1,1] is coupled to one end of the eFuse E (e.g., eFuse E[1,1]), and the other end of eFuse E[1,1] is coupled to ground. The gate of transistor M[1,1] is driven by a word line WLB[1]. When an eFuse memory cell MC (e.g., memory cell MC[1,1]) is read or programmed, a transistor M (e.g., transistor M[1,1]) serves as a current path for the respective current Isa[1] or Ibsl[1] to flow through transistor M[1,1] to ground.

An eFuse E generally includes two logic states, e.g., a Low and a High. In some embodiments, an eFuse E is Low when its resistance is Low and is High when its resistance is High. For example, if R represents the resistance of an eFuse E, the eFuse E is Low if R is less than about 100 Ohm, and is High if R is higher than about 10K Ohm (e.g., the eFuse E is an open circuit). In some embodiments, eFuses E in memory array 100 are Low after memory array 100 is manufactured and an eFuse E is programmed to be a High. The logic level of an eFuse E represents the data logic of the corresponding memory cell MC. For example, if an eFuse (e.g., eFuse E[1,1]) is Low then memory cell MC[1,1] is considered storing a Low, but if the eFuse E[1,1] is High, then memory cell MC[1,1] is considered storing a High. To determine the logic state or the data of a memory cell MC, the data is detected at the corresponding bit line BL. For example, to read the data from memory cell M[1,1], if bit line BL[1], at the time of reading, is detected High then the data of memory cell M[1,1] is High. But if bit line BL[1], at the time of reading, is detected Low, then the data of memory cell M[1,1] is Low. In some embodiments, the resistance R of an eFuse E is Low when the eFuse E is closed, and its resistance R is High when eFuse E is open. The current Ib1s used to burn (e.g., open/break) an eFuse E varies depending on technologies. For example, in some embodiments related to the 40 nm process technology node, current Ib1s to program an eFuse E is in the range of 40 mA. An eFuse memory cell can be accessed for programming or reading. A row or a column containing an accessed eFuse memory cell is called an accessed row or an accessed column (e.g., a program/read row or a program/read column). A row or a column without an accessed cell is called an un-accessed row or un-accessed column (e.g., an un-program/un-read row or an un-program/un-read column).

A word line WLB applied at the gates of transistor M in a row controls (e.g., turns on or off) the corresponding plurality of transistors M in the row. For example, if a word line, e.g., word line WLB[1] for row 1, is activated (e.g., applied with a High), word line WLB[1] turns on the set of transistors M[1,1] to M[1,m] in row 1. But if word line WLB[1] is de-activated, word line WLB[1] turns off the set of transistors M[1,1] to M[1,m] in row 1.

A sense amplifier SA is used to read/sense the data in memory cells MC in a column. In some embodiments, a sense amplifier SA, when appropriate, provides a High to a corresponding bit line BL that represents the High data to be read from a memory cell MC. A current Isa (e.g., current Isa[1]) generated by a corresponding sense amplifier SA (e.g., sense amplifier SA[1]) is used to read data from a memory cell MC (e.g., one of a memory cell MC[1,1] to MC[n,1] in column 1) coupled to the corresponding bit line BL (e.g., bit line BL[1]). In some embodiments, the current Isa to read an eFuse E is in the range of 400 µA. Sense amplifiers SA are used for illustration, other circuitries are within the scope of the various embodiments.

Voltage stress to a transistor occurs when voltage VGS, the voltage drop across the gate and the source, and/or voltage VGD, the voltage drop across the gate and the drain, of the transistor is not zero. The larger the voltage, the higher stress level the transistor experiences. In some embodiments, the stress acceptable for a transistor is measured by a "time to live" Tstress (not labeled) for that transistor, which is the time duration that will cause permanent damage to the transistor if the transistor is continuously subject to a specific stress condition. For example, at a particular stress condition, e.g., at a certain voltage VGD and/or voltage VGS, the related transistor, even though is subject to the voltage stress, can still function normally if the stress is removed before the time Tstress elapses. But if the transistor is continued to be subject to the stress after time Tstress elapses, the transistor can be irreversibly damaged. In some embodiments, the time to live Tstress for a particular transistor is acquired through simulation, e.g., by applying a particular voltage VGD and/or voltage VGS, and determining the time after which the transistor will be damaged.

In some embodiments, when an eFuse memory cell MC is being programmed, some memory cells MC are subject to less stress or insignificant stress or at a stress level within the acceptable time to live Tstress, considering the design choices and/or the costs to completely eliminate the stress. For example, memory cell MC[1,1] is programmed. As a result, word line WLB[1] is activated (e.g., applied with a Low) to turn on memory cell MC[1,1], i.e., turn on transistor M[1,1], which also turns on transistors M[1,2] to M[1,m] in row 1. At the same time, transistor BLS[1] is also turned on to provide a high voltage (e.g., voltage VPRG) to bit line BL[1] or the source of transistor M[1,1]. As a result, voltage VGD of transistor M[1,1] is at 0V, and transistor M[1,1] is subject to no stress with respect to voltage VGD. At the same time, transistors BLS[2] to BLS[m] in column 2 to column m, however, are turned off, and are therefore electrically disconnected from the respective bit lines BL[2] to BL[m]. As a result, bit lines BL[2] to BL[m] are floating. Further, the sources of transistors M[1,2] to M[1,m] are at voltage Vtp wherein Vtp is the threshold voltage of a PMOS transistor. Because the gates of transistors M[1,2] to M[1,m] are Low, the drains of transistors M[1,2] to M[1,m] are Low, voltage VGD of transistors M[1,2] to M[1,m] are 0 V, transistors M[1,2] to M[1,m] are not subject to stress from voltage VGD. Further, because the sources of transistors M[1,2] to M[1,m] are floating, voltage VGS of transistors M[1,2] to M[1,m] are at Vtp, transistors M[1,2] to M[1,m] are subject to insignificant stress from voltage VGS.

Exemplary Method For the Memory Array in FIG. 1

Figure 2:
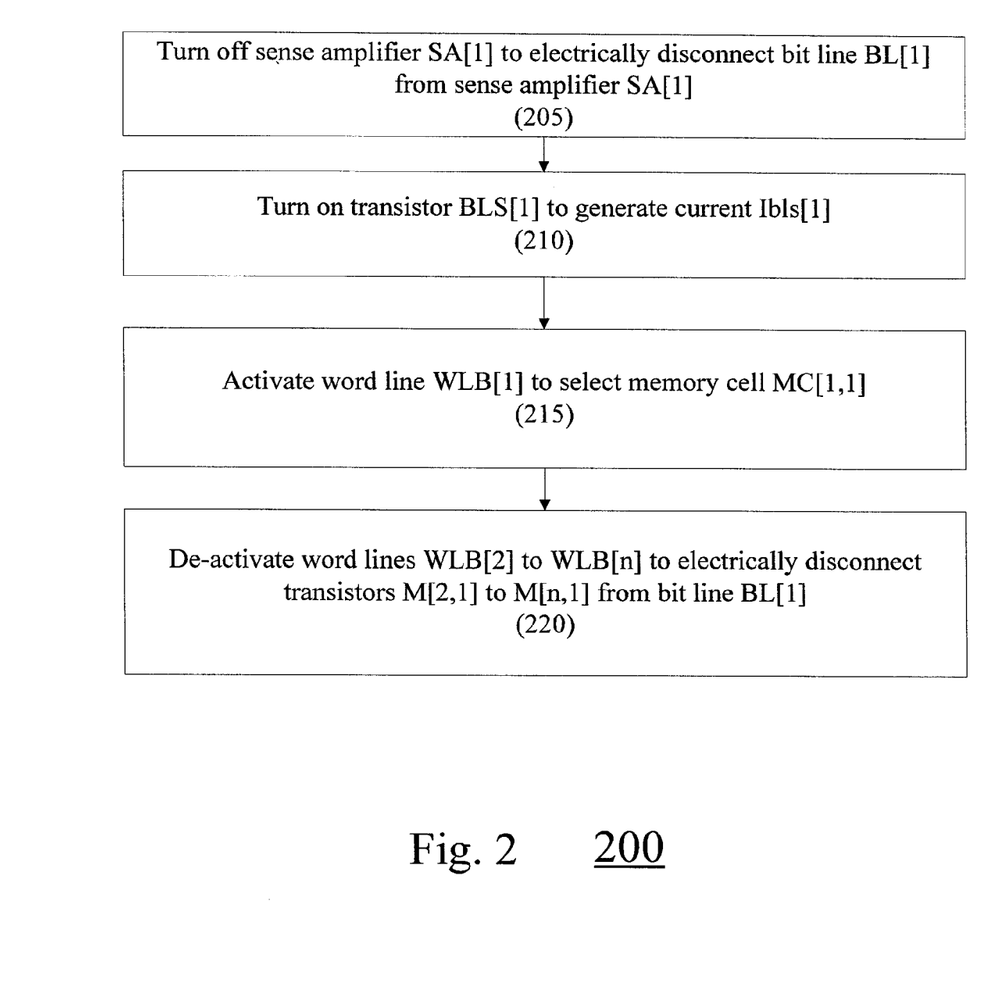
FIG. 2 is a flowchart illustrating a method of programming an eFuse memory cell in the eFuse memory array of FIG. 1, in accordance with some embodiments.

FIG. 2 is a flowchart illustrating a method 200 of programming an eFuse memory cell MC[1,1], in accordance with some embodiments. In effect, eFuse E[1,1] is programmed (e.g., burned, opened, etc.).

In step 205, sense amplifier SA[1] is turned off to electrically disconnect bit line BL[1] from sense amplifier SA[1].

In step 210, transistor BLS[1] is turned on to apply a high voltage VPRG at the bit line BL[1].

In step 215, word line WLB[1] is activated with a Low to select transistor M[1,1] and thus memory cell MC[1,1].

In step 220, word lines WLB[2] to WLB[n] are de-activated with a High to electrically disconnect transistors M[2,1] to M[n,1] from row 2 to row n from bit line BL[1]. In some embodiments, because bit line BL[1] is at high voltage VPRG, word lines WLB[2] to WLB[n] are applied with voltage VPRG so that voltages VGS of transistors M[2,1] to M[n,1] are at 0 V. Voltage VPRG is conveniently acquired as it is used to program the memory cell MC[1,1]. Voltage VGD of transistors M[2,1] to M[n,1], however, are at VPRG (e.g., VPRG-0V). In some other embodiments, word lines WLB[2] to WLB[n] are applied with voltage VPRG-Vtp sufficient to turn off transistors M[2,1] to M[n,1] in column 1 and from row 2 to row n, to reduce voltage VGD of those transistors to VPRG-Vtp, which reduce the stress caused by voltage VGD. Voltage VPRG-Vtp, however, is separately generated from voltage VPRG.

From the above steps, current Ibls[1] flows from transistor BLS[1] through transistor M[1,1] and eFuse E[1,1] to break eFuse E[1,1]. Stated another way, eFuse E[1,1] is opened or programmed to a High.

Figure 3:
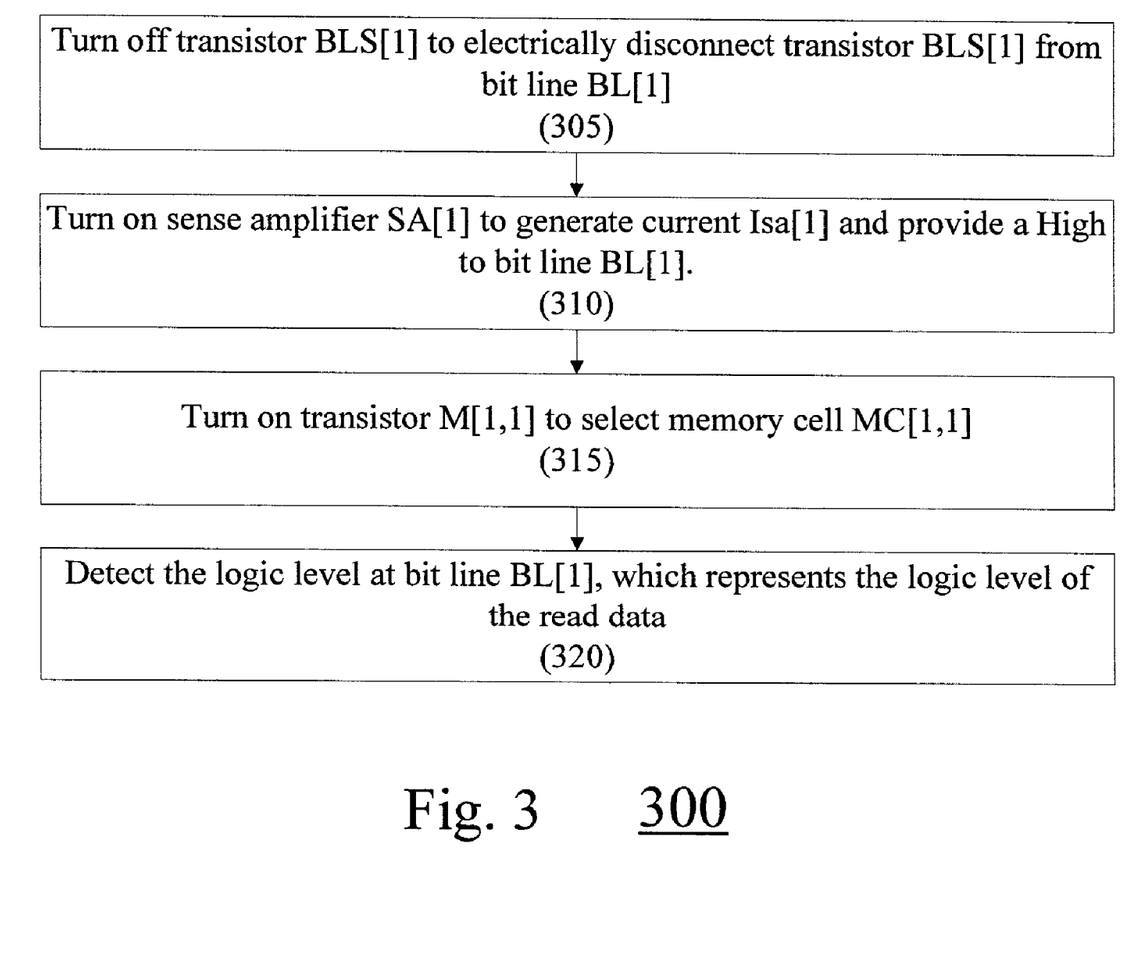
FIG. 3 is a flowchart illustrating a method of reading an eFuse memory cell in the eFuse memory array of FIG. 1, in accordance with some embodiments.

FIG. 3 is a flowchart 300 illustrating a method for reading data from memory cell M[1,1], in accordance with some embodiments.

In step 305, transistor BLS[1] is turned off and therefore electrically disconnected from bit line BL[1].

In step 310, sense amplifier SA[1] is turned on to electrically couple the sense amplifier SA[1] to bit line BL[1].

In step 315, transistor M[1,1] is turned on to select memory cell MC[1,1].

In the above steps, if eFuse[1,1] is open, bit line BL[1] remains at the High logic level provided by sense amplifier SA[1]. But if eFuse[1,1] is closed, current Isa[1] flow through transistor M[1,1] and eFuse E[1,1] to ground. As a result, the voltage level of bit line BL[1] is pulled to the voltage level at the source of transistor M[1,1], which is ground or Low.

In step 320, the logic state of bit line BL[1] is detected (e.g., read), which represents the logic state of eFuse E[1,1] or the logic state or data of memory cell MC[1,1].

Exemplary Circuit in Some Other Embodiments

Figure 4:
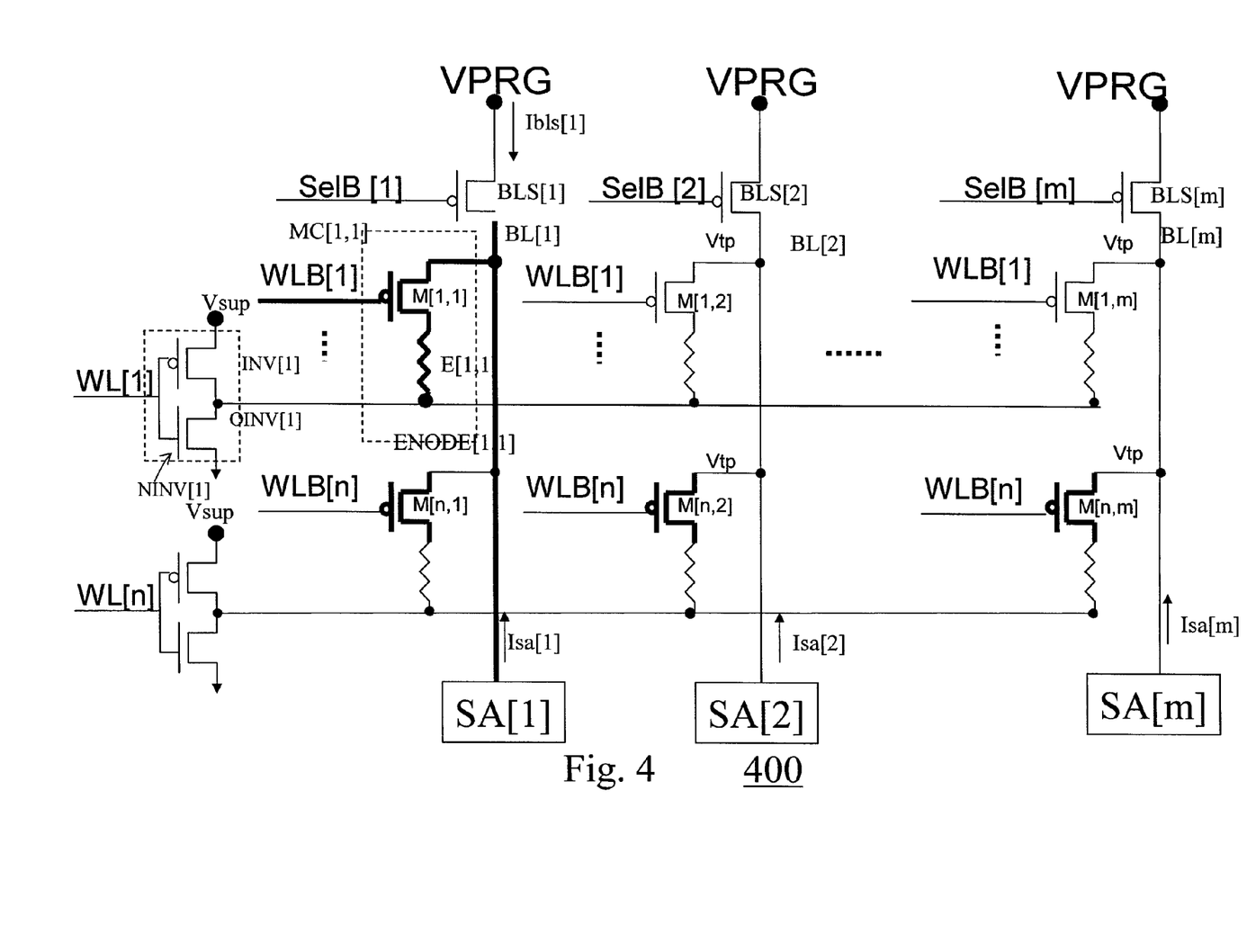
FIG. 4 is a diagram of an eFuse memory array in accordance with some embodiments.

FIG. 4 is a diagram of an eFuse memory array 400, in accordance with some embodiments.

Compared with memory array 100, memory array 400 includes, in addition to the elements of memory 100, inverters INV[1] to INV[n] for n rows from row 1 to row n of memory array 400. For simplicity, however, only inverter INV[1] for row 1 with its detailed element is labeled. Signals WL[1] to WL[n] control the corresponding inverters INV[1] to INV[n] from row 1 to row n. Further, the ends of eFuses E that are coupled to ground in memory array 100, which are nodes ENODES in memory array 400, are coupled to the outputs (e.g., nodes OINV) of inverters INV in FIG. 4. In some embodiments, each output node OINV of an inverter INV is coupled to each node ENODE of eFuses E in the same row. For example, node OINV[1] of inverter INV[1]is coupled to each node ENODE[1,1] to node ENODE[1,m] of eFuses E[1,1] to E[1,m] in row 1. Node OINV[2] is coupled to each node ENODE[2,1] to node ENODE[2,m] of eFuses E[2,1] to E[2,m] in row 2, and node OINV[3] is coupled to each node ENODE[3,1] to node ENODE[3,m] of eFuses E[3,1] to E[3, m] in row 3, etc. The voltage level at nodes OINV varies based on the operational voltage VDD or the ground level of inverters INV. For example, when signal WL[1] for row 1 is Low, node OINV[1] is High at the voltage level of voltage Vsup that provides the operational voltage for inverter INV[1]. But when signal WL[1] is High, node OINV[1] is Low at the voltage level of the source of NMOS transistor NINV[1] of inverter INV[1], which is ground. When voltage Vsup or the voltage level at the source of transistor NINV[1] varies (e.g., shifted by a level shifter), the voltage level at node OINV[1] changes/shifts accordingly. Inverters INV are used in FIG. 4 for illustration, other circuitry, voltage sources, etc., configured to provide the various voltage levels to nodes ENODE are within the scope of this disclosure.

In some embodiments, when an eFuse E of a memory cell is being programmed, some program transistors (e.g., transistors M) are subject to reduced stress, insignificant stress or a stress level acceptable considering the design choices and the costs to completely eliminate the stress. For illustration, memory cell MC[1,1] is programmed. Row 1 and column 1 are called a "program" row and a "program" column. Row 2 to row n and column 2 to column m are called un-program rows and un-program columns, respectively. Because row 1 is a program row, word line WLB[1] is activated (e.g., applied with a Low) to turn on memory cell MC[1,1]. As a result, transistors M[1,1] to M[1,m] in row 1 are turned on. Word lines WLB[2] to WLB[n] are de-activated (e.g., applied with a High) to turn off memory cells MC in un-program row 2 to row n. At the same time, transistor BLS[1] is also turned on to provide a high voltage VPRG to bit line BL[1] or the source of transistor M[1,1]. Transistors BLS[2] to BLS[m] of column 2 to column m, however, are turned off, and are therefore electrically disconnected from the respective bit lines BL[2] to BL[m]. As a result, bit lines BL[2] to BL[m] are floating.

In some embodiments, when memory cell M[1,1] is being programmed, word line WLB[1] controlling the gates of transistors M[1,1] to M[1, m] are Low. Node OINV[1] is also set to Low. As a result, nodes ENODE[1,1] to ENODE[1,m] of transistors M[1,1] to M[1,m] in row 1 that are coupled to node OINV[1] are Low. Consequently, transistors M[1,1] to M[1, m] in FIG. 4 are configured in a similar condition as transistors M[1,1] to M[1,m] in FIG. 1. The stress condition of transistors M[1,1] to M[1,m] in FIG. 4 is therefore about the same as the stress condition of transistors M[1,1] to M[1,m] in FIG. 1.

In some embodiments, the voltage level of word lines WLB [2] to WLB[n] to turn off memory cells in un-program row 2 to row n and the voltage level of nodes OINV[2] to OINV[n] for the un-program row 2 to row n are set based on a design choice considering the acceptable stress for the related transistors and the complexity and/or cost of generating the desired level for word lines WLB[2] to WLB[n] and/or for nodes OINV[2] to OINV[n]. Exemplary voltage level values for word lines WLB[2] to WLB[n] and for nodes OINV[2] to OINV[n] include voltage VPRG, VPRG-Vtp, voltage Vdd, etc. Voltage Vtp is the threshold voltage for PMOS transistors M.

For illustration, the voltage level for word lines WLB[2] to WLB[n] for un-program row 2 to row n is set at voltage VPRG to turn off transistors M in un-program row 2 to row n. For a further illustration, the voltage level at nodes OINV[2] to OINV[n] is also set at voltage VPRG. As a result, in an un program row (e.g., row 2), transistors M[2,1] to M[2,m] are subject to zero stress with respect to voltage VGD because voltages VGD of transistors M[2,1] to M[2,m] are at 0 V. Generating the voltage value VPRG for node OINV[2], however, is more expensive and/or more complex than generating another voltage value (e.g., voltage value Vdd). On the other hand, if the voltage at node OINV[2] is set at voltage Vdd, transistors M[2,1] to M[2,m] are subject to increased stress with respect to voltage VGD because the voltage VGD for transistors M[2,1] to M[2,m] is at VPRG-Vdd, which is not 0 V. Providing voltage Vdd to node OINV[2], however, is inexpensive because voltage Vdd can be conveniently acquired from an operational voltage of other circuitry in memory array 300.

When word line WLB[2] to WLB[n] are at voltage VPRG, voltage VGS for transistors M[2,1] to M[n,1] in column 1 is at 0 V, which causes no stress to transistors M[2,1] to M[n,1] in column 1. Transistors in column 2 to column m for row 2 to row n are subject to the stress level of voltage VGS at VPRG-Vtp because voltage VGS for these transistors is at VPRG-Vtp.

Exemplary Methods for the Memory Array in FIG. 4

Figure 5:
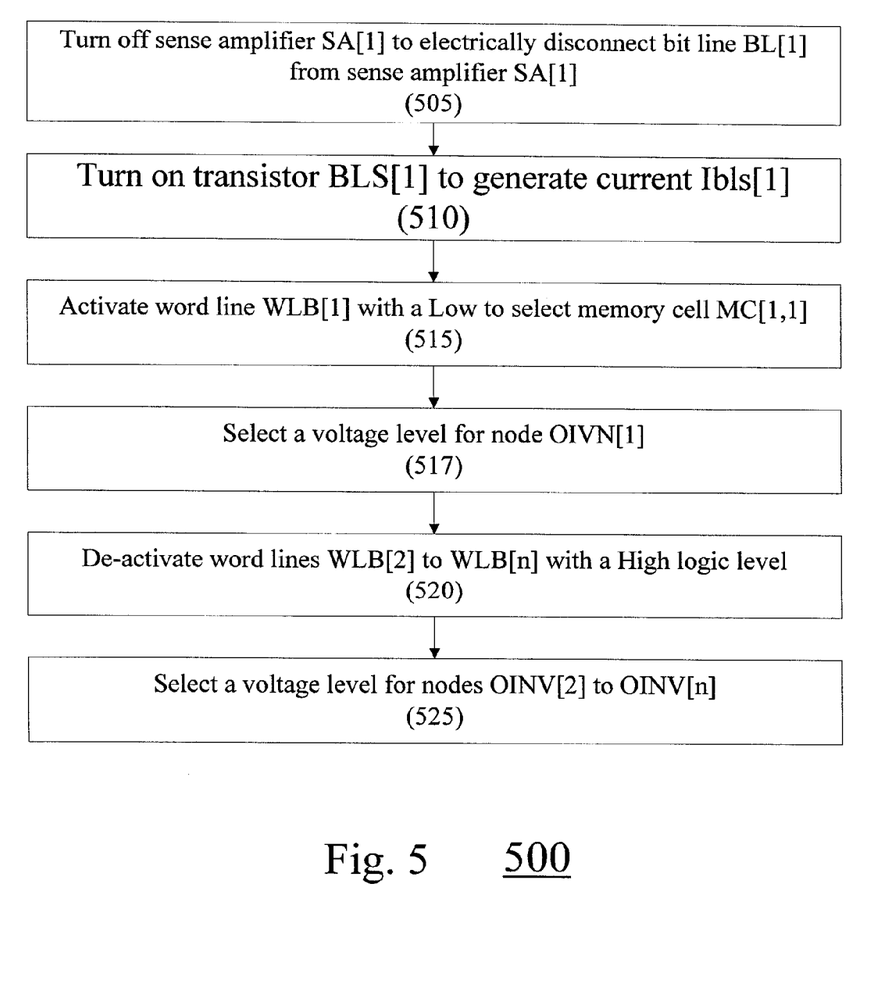
FIG. 5 is a flowchart illustrating a method of programming an eFuse memory cell in the eFuse memory array of FIG. 4, in accordance with some embodiments.

FIG. 5 is a flowchart illustrating a method 500 of programming an eFuse memory cell MC[1,1], in accordance with some embodiments. In effect, eFuse E[1,1] is programmed (e.g., burned, opened, etc.).

In step 505, sense amplifier SA[1] is turned off to electrically disconnect bit line BL[1] from sense amplifier SA[1].

In step 510, transistor BLS[1] is turned on to apply a high voltage VPRG at the bit line BL[1].

In step 515, word line WLB[1] is activated with a Low to select transistor M[1,1] and thus memory cell MC[1,1].

In step 517, a voltage value for node OINV[1] and thus nodes ENODE[1,1] to ENODE[1,m] are selected. In some embodiments, node OINV[1] is set at 0 V. As a result, signal WL[1] is set at a High to be converted to a Low at node OINV[1] by inverter INV[1]. In some embodiments, the sources of transistors NINV are tied to ground to get a maximum current from voltage Vsup and reduces stress for transistors M because the higher the voltage swing from voltage Vsup to its ground reference (e.g., the sources of transistors NINV), the larger the current and the less stress for transistors M.

In step 520, word lines WLB[2] to WLB[n] are de-activated with a High logic level to disconnect transistors M[2,1] to M[n,1] from bit line BL[1].

In step 525, a voltage level for nodes OINV[2] to OINV[n] from row 2 to row n is selected. In some embodiments, because the logic level for word lines WLB[2] to WLB[n] is High, the logic level for nodes OINV[2] to OINV[n] is also High. As a result, signals WL[2] to WL[n] are set to Low to be inverted to High at the respective nodes OINV[2] to OINV[n]

by inverters INV[2] to INV[n]. The High voltage level for nodes OINV[2] to OINV[n] is provided by voltage Vsup.

In some embodiments, the voltage level for word lines WLB[2] to WLB[n] and for nodes OINV[2] to OINV[n] is set such that the stress level caused by voltage VGD and/or voltage VGS to affected transistors M is acceptable.

In some embodiments, because bit line BL[1] for column 1 is at the high voltage VPRG, word lines WLB[2] to WLB[n] for row 2 to row n are applied with voltage VPRG so that voltages VGS of transistors M[2,1] to M[n,1] are at 0 V. Voltage VPRG is conveniently acquired as it is used to program the memory cell MC[1,1]. Nodes OINV[2] to OINV[n] are set at voltage VPRG. As a result, voltage VGD of transistors M[2,1] to M[n,1] are at 0 V (=VPRG–VPRG).

In some other embodiments, word lines WLB[2] to WLB[n] are applied with voltage VPRG-Vtp sufficient to turn off transistors M[2,1] to M[n,1] in column 1 and from row 2 to row n. Nodes OINV[2] to OINV[n] are set at voltage VPRG-Vtp. As a result, voltage VGD of transistors M[2,1] to M[n,1] are at 0 V (=VPRG Vtp–(VPRG–Vtp)).

In some other embodiments, word lines WLB[2] to WLB[n] for row 2 to row n are applied with voltage Vdd sufficient to turn off transistors M[2,1] to M[n,1] in column 1 and transistors from row 2 to row n. Nodes OINV[2] to OINV[n] are set at Vdd. As a result, voltage VGD of transistors M[2,1] to M[n,1] are at 0 V (=Vdd–Vdd).

From the above steps, current Ibls[1] flows from transistor BLS[1] through transistor M[1,1] and eFuse E[1,1] to open eFuse E[1,1]. Stated another way, eFuse E[1,1] is programmed to a High.

Figure 6:
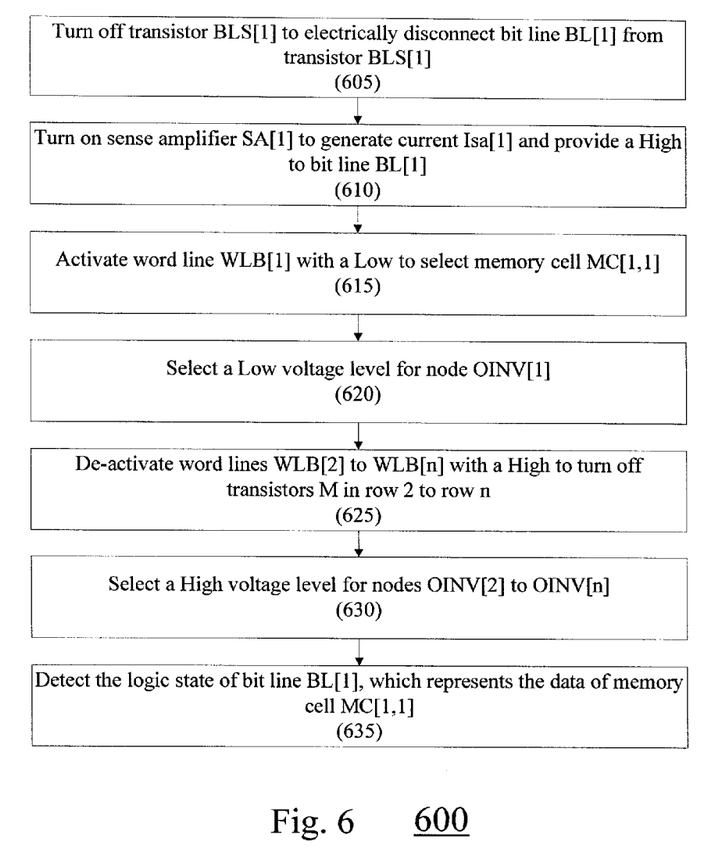
FIG. 6 is a flowchart illustrating a method of reading an eFuse memory cell in the eFuse memory array of FIG. 4, in accordance with some embodiments.

FIG. 6 is a flowchart 600 illustrating a method for reading data from memory cell M[1,1], in accordance with some embodiments.

In step 605, transistor BLS[1] is turned off and is therefore electrically disconnected from bit line BL[1].

In step 610, sense amplifier SA[1] is turned on to electrically couple the sense amplifier SA[1] to bit line BL[1].

In step 615, word line WLB[1] is activated Low to turn on transistor M[1,1] and thus select memory cell MC[1,1].

In step 620, a Low voltage level is selected for node OINV[1].

In step 625, word lines WLB[2] to WLB[n] for row 2 to row n are deactivated High to turn off transistors M in row 2 to row n.

In step 630, a High voltage level for nodes OINV[2] to OINV[n] is selected.

In the above steps, if eFuse[1,1] is open, bit line BL[1] remains at the High logic level provided by sense amplifier SA[1]. But if eFuse[1,1] is closed, current Isa[1] flow through transistor M[1,1] and eFuse E[1,1] to ground. As a result, the voltage level of bit line BL[1] is pulled to the voltage level at the source transistor M[1,1], which is ground or Low.

In step 635, the logic state of bit line BL[1] is detected (e.g., read), which represents the logic state of eFuse E[1,1] or the logic state or data of memory cell MC[1,1].

In the above description, eFuse memory cell MC[1,1] is used as an example. The same methods of programming and reading apply for any selected memory cell MC.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., low or high) of the various signals used in the above description is also for illustration purposes, embodiments are not limited to a particular level when a signal is activated and/or deactivated, but, rather, selecting such a level is a matter of design choice.

For example, some embodiments regard a memory array comprising: a plurality of eFuse memory cells arranged in rows and columns, a plurality of bit lines, and a plurality of word lines. A column includes a bit line selector, a bit line coupled to the bit line selector, and a plurality of eFuse memory cells. A memory cell of the column includes a PMOS transistor and an eFuse. A drain of the PMOS transistor is coupled to a first end of the eFuse. A gate of the PMOS transistor is coupled to a word line. A source of the PMOS transistor is coupled to the bit line of the column.

For another example, some embodiments regard a memory array comprising a plurality of eFuse memory cells arranged in rows and columns. At lease one eFuse memory cell includes a PMOS transistor and an eFuse. A first end of the eFuse is coupled to a drain of the PMOS transistor. At least one column includes a bit line select device, a plurality of eFuse memory cells in the at least one column, and a bit line coupling the bit line select device and a plurality of sources of a plurality of PMOS transistors of the plurality of eFuse memory cells in the at least one column. At least one row includes a plurality of eFuse memory cells in the at least one row, a word line coupling a plurality of gates of a plurality of PMOS transistors of the plurality of eFuse memory cells in the at least one row, and a voltage source is configured to provide a voltage value at a second end of a plurality of eFuses of the plurality of eFuse memory cells in the at least one row.

For another example, some embodiments regard a method of operating an eFuse memory cell in a memory array of a plurality of eFuse memory cells, the eFuse memory cell including a PMOS transistor and an eFuse, a first end of the eFuse coupled to a drain of the PMOS transistor, the method comprising: activating the PMOS transistor; and generating a current flowing through a bit line coupled to a source of the PMOS transistor. If the eFuse memory cell is in a program mode, using a first power source coupled to the bit line to generate the current having a first current value sufficient to program the eFuse. But if the eFuse memory cell is in a read mode, using a second power source coupled to the bit line to generate the current having a second current value sufficient to read the eFuse; the first current value differing from the second current value.

The above methods show exemplary steps, but they are not necessarily performed in the order shown. Steps may be added, replaced, changed order, and/or eliminated as appropriate, in accordance with the spirit and scope of disclosed embodiments.

What is claimed is:
1. A memory array comprising:
a plurality of eFuse memory cells arranged in a plurality of columns; and
a plurality of bit lines; wherein
a column of the plurality of columns of the eFuse memory cells includes:
a bit line selector;
a bit line coupled to the bit line selector; and
a set of the plurality of eFuse memory cells; a memory cell of the set of the plurality of eFuse memory cells of the column includes a PMOS transistor and an eFuse; a drain of the PMOS transistor coupled to a first end of the eFuse; a gate of the PMOS transistor coupled to a word line; a source of the PMOS transistor coupled to the bit line of the column.

2. The memory array of claim 1 wherein a second end of the eFuse of the memory cell of the set of the plurality of eFuse memory cells of the column is coupled to ground.

3. The memory array of claim 1 wherein a second end of the eFuse of the memory cell of the set of the plurality of eFuse memory cells of the column is coupled to a voltage source.

4. The memory array of claim 3 further comprising an inverter configured to provide the voltage source.

5. The memory array of claim 3 wherein the bit line selector is a PMOS transistor having a drain coupled to the bit line of the column.

6. A memory array, comprising:
a plurality of eFuse memory cells arranged in rows and columns; wherein
at lease one eFuse memory cell includes:
a PMOS transistor; and
an eFuse; a first end of the eFuse coupled to a drain of the PMOS transistor;
at least one column includes:
a bit line select device;
a first plurality of eFuse memory cells in the at least one column; and
a bit line coupling the bit line select device and a plurality of sources of a plurality of PMOS transistors of the first plurality of eFuse memory cells in the at least one column; and
at least one row includes:
a second plurality of eFuse memory cells in the at least one row;
a word line coupling a plurality of gates of a plurality of PMOS transistors of the second plurality of eFuse memory cells in the at least one row; and
a voltage source configured to provide a voltage value at a second end of a plurality of eFuses of the second plurality of eFuse memory cells in the at least one row.

7. The memory array of claim 6 further comprising at least one inverter configured to serve as the voltage source of the at least one row.

8. The memory array of claim 6 wherein, when an eFuse memory cell of the plurality of eFuse memory cells of the memory array is programmed, at least one word line of at least one un-program row is configured to receive a first voltage value, and at least one voltage source associated with the at least one un- program row is configured to provide a second voltage value.

9. The memory array of claim 8 wherein at least the first voltage value or the second voltage value is selected from a program voltage used to program the eFuse memory cell, a voltage used to read the eFuse memory cell, the program voltage in combination with a threshold voltage of the PMOS transistor of the eFuse memory cell.

10. The memory array of claim 6 wherein the bit line select device of the at least one column is configured to provide a current to program the first plurality of eFuse memory cells in the at least one column.

11. The memory array of claim 6 wherein, when an eFuse memory cell of the plurality of eFuse memory cells of the memory array is programmed, at least one word line of at least one un-program row is configured to receive a first high logic level, and at least one voltage source associated with the at least one un- program row is configured to provide a second high voltage level.

12. The memory array of claim 6 wherein the at least one column further includes a read circuit to read data from the first plurality of eFuse memory cells in the at least one column.

13. A method of operating an eFuse memory cell in a memory array of a plurality of eFuse memory cells, the eFuse memory cell including a PMOS transistor and an eFuse, a first end of the eFuse coupled to a drain of the PMOS transistor, the method comprising:
activating the PMOS transistor; and
selectively coupling a first power source or a second power source to a bit line coupled to a source of the PMOS transistor;
wherein the step of selectively coupling comprises:
using the first power source to generate a current flowing through the bit line and having a first current value sufficient to program the eFuse, if the eFuse memory cell is in a program mode; and
using the second power source to generate the current having a second current value sufficient to read the eFuse, if the eFuse memory cell is in a read mode; the first current value differing from the second current value.

14. The method of claim 13 wherein a plurality of second ends of a plurality of eFuses in the memory array are coupled to a plurality of voltage sources.

15. The method of claim 14 wherein a voltage value of at least one voltage source is configured to affect a voltage stress caused by a voltage drop across a gate and a drain of at least one PMOS transistor of at least one eFuse memory cell of the memory array.

16. The method of claim 14 wherein a voltage source of the plurality of voltage sources is configured to control a plurality of second ends of a plurality of eFuses in a same row.

17. The method of claim 14 further comprising using at least one inverter as at least one voltage source of the plurality of voltage sources.

18. The method of claim 13 wherein a plurality of second ends of a plurality of eFuses in the memory array are coupled to ground.

19. The method of claim 13 wherein a first voltage value at a plurality of second ends of a plurality of eFuses in an accessed row is different from a second voltage value at a plurality of second ends of a plurality of eFuses in an unaccessed row.

20. The method of claim 19 wherein the first voltage value is from an output of a first inverter and the second voltage value is from an output of a second inverter.

* * * * *